(12) United States Patent
Foster et al.

(10) Patent No.: US 7,650,798 B2
(45) Date of Patent: Jan. 26, 2010

(54) VENTED HIGH-TEMPERATURE PIEZOELECTRIC-BASED FIELD DEVICE

(75) Inventors: Jeffry D. Foster, St. Louis Park, MN (US); Robert C. Hedtke, Young America, MN (US)

(73) Assignee: Rosemount Inc., Eden Prairie, MN (US)

( * ) Notice: Subject to any disclaimer, the term of this patent is extended or adjusted under 35 U.S.C. 154(b) by 0 days.

(21) Appl. No.: 12/042,593

(22) Filed: Mar. 5, 2008

(65) Prior Publication Data

US 2009/0019944 A1    Jan. 22, 2009

Related U.S. Application Data

(60) Provisional application No. 60/905,144, filed on Mar. 6, 2007.

(51) Int. Cl.
*G01F 1/32* (2006.01)
(52) U.S. Cl. .................................................. 73/861.24
(58) Field of Classification Search ............. 73/861.22, 73/861.24, 861.23
See application file for complete search history.

(56) References Cited

U.S. PATENT DOCUMENTS

| | | | |
|---|---|---|---|
| 3,727,084 A | | 4/1973 | Epstein ........................ 310/9.5 |
| 4,926,695 A | | 5/1990 | Kleven et al. ............. 73/861.24 |
| 5,209,125 A | * | 5/1993 | Kalinoski et al. ......... 73/861.24 |
| 5,343,762 A | | 9/1994 | Beulke ..................... 73/861.24 |
| 6,352,000 B1 | * | 3/2002 | Getman et al. ........... 73/861.22 |
| 6,752,027 B1 | * | 6/2004 | Kalinoski ................. 73/861.22 |

OTHER PUBLICATIONS

International Search Report and Written Opinion for application PCT/US2008/002912, dated Nov. 6, 2008.

* cited by examiner

*Primary Examiner*—Jewel Thompson
(74) *Attorney, Agent, or Firm*—Christopher R. Christenson; Westman, Champlin & Kelly, P.A.

(57) ABSTRACT

A process fluid sensor for sensing a characteristic of a process fluid is provided. The process fluid sensor includes a metallic sensor body that defines a chamber therein. A piezoelectric crystal element is disposed proximate the chamber and is configured to generate an electrical signal in response to a mechanical input. The piezoelectric crystal element is mechanically coupleable to the process fluid, but is sealed within the sensor body with the exception of a gaseous pathway. A vortex flowmeter utilizing the process fluid sensor is also provided.

14 Claims, 4 Drawing Sheets

VENTED HIGH-TEMPERATURE PIEZOELECTRIC-BASED FIELD DEVICE

CROSS-REFERENCE TO RELATED APPLICATION

The present application is based on and claims the benefit of U.S. provisional patent application Ser. No. 60/905,144, filed Mar. 6, 2007, the content of which is hereby incorporated by reference in its entirety.

BACKGROUND

Field devices such as vortex flowmeters are commonly used in industrial processes to measure a flow of process fluid, such as slurries, liquids, vapors and gases of chemicals, petroleum, pharmaceuticals, food and other fluid-type plant processes. Typically, vortex flowmeters utilize a shedding bar placed in a fluid flow to cause or generate vortices on opposite sides of the shedding bar. The frequency of vortex shedding for a shedding bar is directly proportional to the velocity of flow in the process fluid. Therefore, vortex flowmeters sense the fluctuating pressures caused by the generated vortices to determine the velocity of the process fluid flow. Example vortex flowmeter implementations can be found in U.S. Pat. No. 4,926,695 to Rosemount Inc., of Eden Prairie, Minn. on May 2, 1990; and U.S. Pat. No. 5,343,762 to Rosemount Inc., of Eden Prairie, Minn. on Sep. 6, 1994, both of which are commonly assigned with the present application.

Piezoelectric crystal-based sensors are commonly used in field devices, such as vortex flowmeters, to detect small mechanical motions, such as those created by vortices in a vortex flowmeter. Because these meters are used in industrial environments, the crystals are commonly sealed in a steel body to protect them from the environment. Since the piezoelectric based-crystals are susceptible to certain reducing atmospheres, these steel bodies in which such crystals are placed, are frequently pre-oxidized to prevent a severe reducing atmosphere from forming within the steel bodies. In practice, sealing piezoelectric-based crystals in pre-oxidized steel bodies may not always be effective. Specifically, over time, the piezoelectric crystals may fail in some high-temperature applications. Accordingly, embodiments of the present invention are generally directed to increasing the longevity of piezoelectric-based crystals in high-temperature industrial monitoring and control applications.

SUMMARY

A process fluid sensor for sensing a characteristic of a process fluid is provided. The process fluid sensor includes a metallic sensor body that defines a chamber therein. A piezoelectric crystal element is disposed proximate the chamber and is configured to generate an electrical signal in response to a mechanical input. The piezoelectric crystal element is mechanically coupleable to the process fluid, but is sealed within the sensor body with the exception of a gaseous pathway. A vortex flowmeter utilizing the process fluid sensor is also provided.

DETAILED DESCRIPTION

Figure 1:
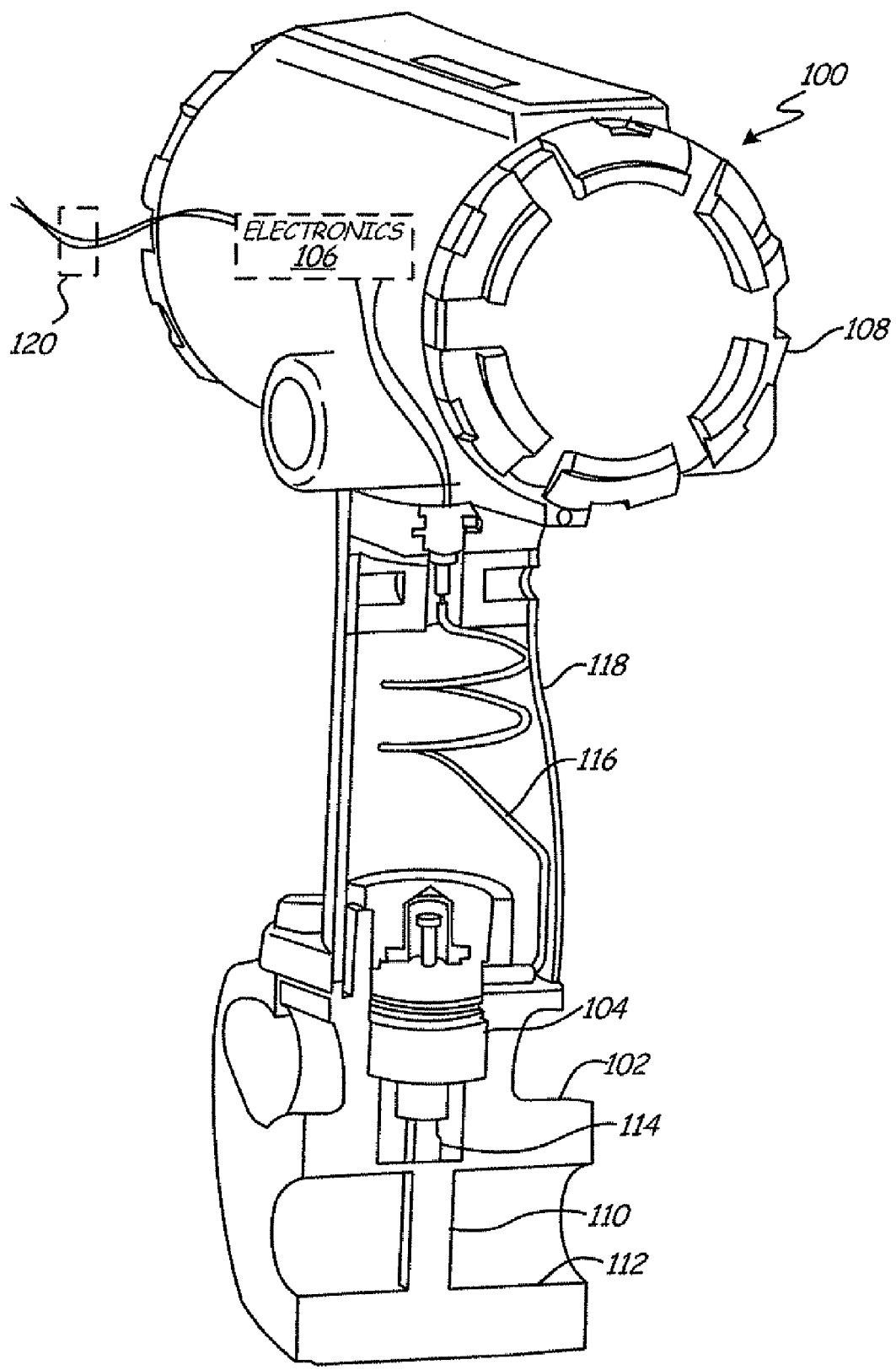
FIG. 1 is a diagrammatic view of a vortex flowmeter in accordance with an embodiment of the present invention.

FIG. 1 is a diagrammatic view of a vortex flowmeter in accordance with an embodiment of the present invention. Flowmeter 100 includes process fluid conduit 102, vortex sensor 104 and transmitter electronics 106 disposed within electronics housing 108. Flow conduit 102 includes vortex bluff body 110 that extends within, and preferably across flow passageway 112. Bluff body 110 is operably coupled to member 114 that conveys movement, such as vibrations, to vortex sensor 104. These minute movements are caused by bluff body 110 generating vortices within the process fluid as the process fluid flows through passageway 112. Vortex sensor 104 is electronically responsive to these slight movements. Known vortex sensors generally employ a piezoelectric sensor that, in accordance with known piezoelectric properties, generates an electrical characteristic, such as a voltage, in response to a mechanical input, such as stress, or movement. Vortex sensor 104 is electrically coupled to transmitter electronics, disposed within housing 108 via connection 116 within shell 118. As illustrated in FIG. 1, transmitter electronics 106 are disposed within housing 108, which in many embodiments is disposed directly upon shell 118. However, in other embodiments, enclosure 108 and transmitter electronics 106 may be disposed remotely from shell 118 and merely connected thereto via suitable conductors. Transmitter electronics 106 includes known circuitry that measures or otherwise senses the electrical characteristic of the vortex sensor and generates a value, or data, related to the velocity of the process fluid flowing through passageway 112. Further, electronics 106 generally includes communication circuitry to communicate the calculated velocity to other devices, such as a control room, or other field devices via a process communication loop illustrated diagrammatically at reference numeral 120. Examples of process communication loops include those in accordance with the Highway Addressable Remote Transducer (HART®) Protocol, the FOUNDATION™ Fieldbus Protocol, or other process communication protocols. Additionally, or alternatively, wireless data transmission protocols can also be employed. In some wired embodiments, flowmeter 100 is able to be wholly powered by energy received through the wire process communication lines through which it communicates.

Flowmeter 100 is considered a field device in that it is generally able to be mounted in the field. The "field" is generally an external area in a process installation that may be subject to climatic extremes, vibrations, changes in humidity, electromagnetic or radio frequency interference, or other environmental challenges. Thus, the robust physical package of flowmeter 100 provides flowmeter 100 with the ability to operate in the "field" for extended periods (such as years) at a time.

Figure 2:
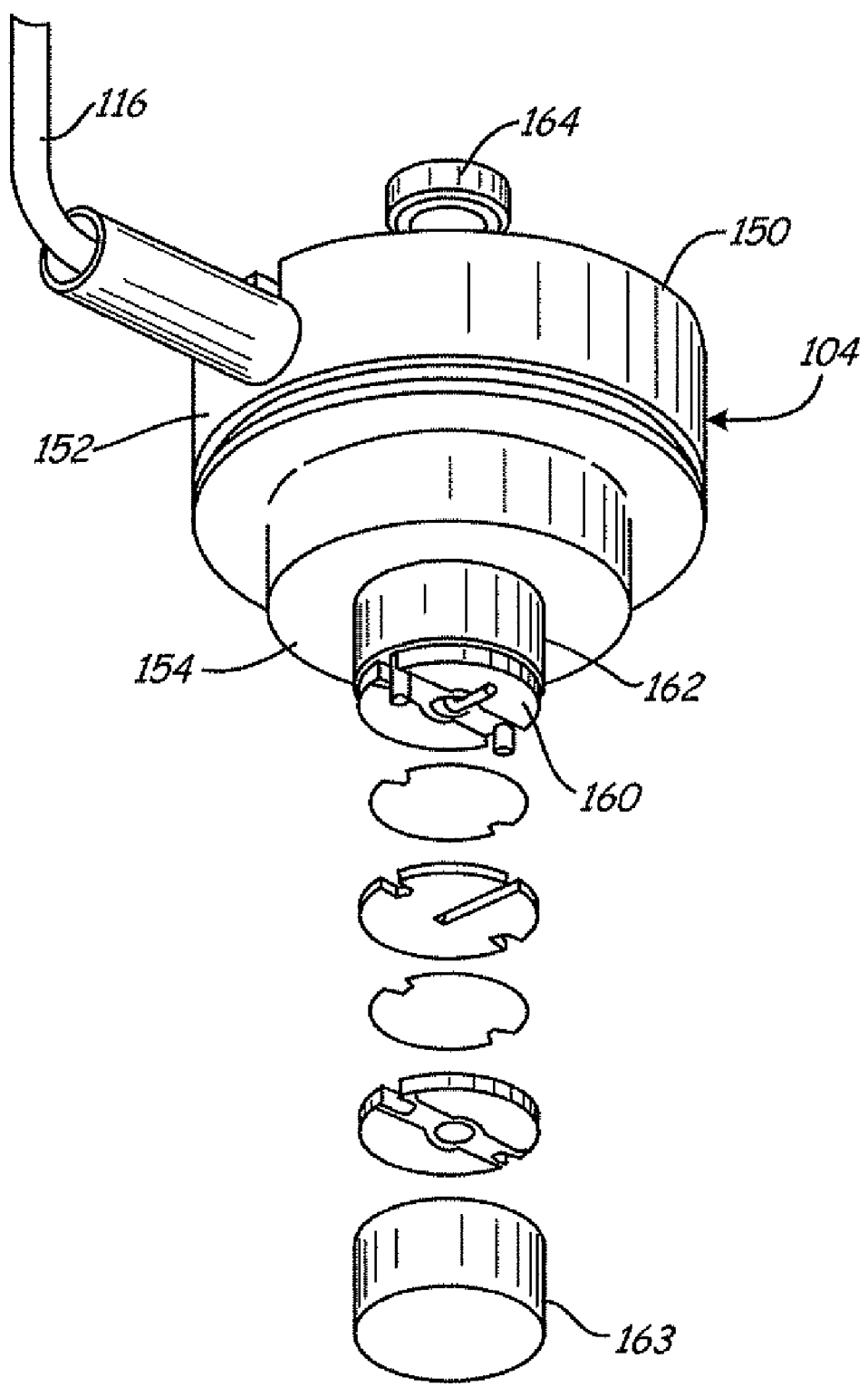
FIG. 2 is a diagrammatic perspective exploded view of a piezoelectric-based vortex sensor in accordance with an embodiment of the present invention.

FIG. 2 is a diagrammatic exploded perspective view of vortex sensor 104 in accordance with an embodiment of the present invention. Sensor 104 includes vortex sensor body 150. Body 150 includes a passageway to allow connection 116 therethrough thereby facilitating passage of electrical conductors from transmitter electronics 106 (shown in FIG. 1) to piezoelectric element 160 disposed upon pedestal 162, which is attached, preferably by brazing, to sensor body 150. The electrical connection allows changes in stress mechanically imparted upon crystal 160 to be measured, or otherwise observed, by transmitter electronics 106. As set forth above, flowmeter 100 is typically used in industrial environments. Accordingly, piezoelectric crystals within flowmeter sensors are commonly sealed within body 150, which is generally comprised of steel, to protect piezoelectric crystal 160 from the industrial environment. In this regard, cap 163 is generally placed over crystal 160 and welded, or otherwise sealed, to body 150 thereby sealing crystal 160 within body 150. However, piezoelectric crystals are susceptible to certain reducing atmospheres. Accordingly, steel body 150 is frequently pre-oxidized to prevent a severe reducing atmosphere from forming within body 150. As used herein, "reducing atmosphere" is intended to mean an environment surrounding the piezoelectric crystal wherein the piezoelectric crystal is apt to gain electrons or otherwise decrease oxidation number. When the piezoelectric crystal gains electrons, it decreases the oxidation number of molecules of the crystal, and this activity is believed to adversely affect the effectiveness of the piezoelectric crystal in transducing changes in mechanical stress. It is believed that within the sealed body of piezoelectric sensor, the reducing atmosphere has catalyst, or some mechanism, that essentially steals oxygen from the crystal and deposits it in the surrounding body, or otherwise affects the piezoelectric crystal. As set forth above, the metallic components of body 150 are preferably pre-oxidized in order to hopefully reduce the degree to which the metallic bodies steal oxygen. However, in some applications, such as high-temperature applications, even the pre-oxidized parts are believed to continue to oxidize over time. Therefore, it is believed that even hermetically sealed parts can leak very slowly, on the order of <$10^{-9}$ cubic centimeters per minute (cc/m). This substantially hermetic enclosure allows oxygen to be stolen from the crystal and deposited within the meter body.

Figure 3:
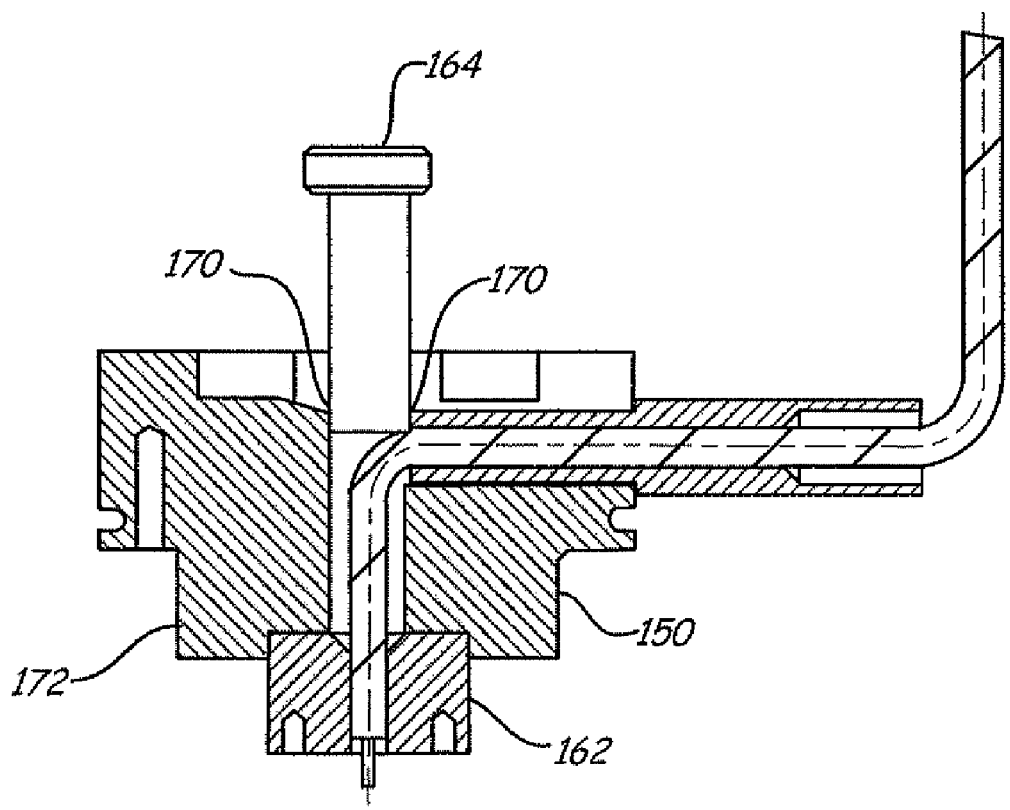
FIG. 3 is a cross-sectional view of a portion of a vortex sensor in accordance with an embodiment of the present invention.

Embodiments of the present invention generally address this perceived problem of oxygen being stolen from the piezoelectric crystal by generating a deliberate slow oxygen leak into the crystal cavity. However, since the vortex sensor may be exposed to various process fluids in industrial environments, it is also important that the deliberate oxygen leak not allow liquid or other process fluids to pass therethrough. In one embodiment, the deliberate leak is introduced by changing the construction of one of the component metal parts that seals the chamber proximate the piezoelectric crystal. Specifically, the part known as a "pull post", illustrated diagrammatically as reference number 164 in FIGS. 2 and 3, is changed from being constructed from a solid metal, such as stainless steel, to a powdered metal. Preferably, the powdered metal pull post has a density of approximately 90% the density of a solid metal part. However, this is merely a preference, and variations in the porosity can be practiced as long as a suitable amount of oxygen can pass therethrough while simultaneously preferably inhibiting liquids. One of the reasons that this embodiment is preferred, is that the entire invention can be practiced merely by replacing a prior art pull post with a powdered metal pull post. However, it is contemplated that embodiments of the present invention can be practiced by deliberately introducing any suitable passageway into the sensor body. Further still, other components, such as pedestal 162, could be constructed, in whole or in part, from powdered metal. Further, while embodiments of the present invention are generally directed to a piezoelectric-based vortex sensor for use in high-temperature industrial settings, embodiments of the present invention are practicable with any industrial piezoelectric-based sensor that experiences oxygen depletion effects in the presence of a reducing atmosphere.

FIG. 3 is a diagrammatic cross sectional view of a portion of vortex sensor 104 in accordance with embodiments of the present invention. As illustrated in FIG. 3, pull post 164 engages aperture 170 to seal aperture 170. Accordingly, pull post 164 is one of the components that forms the substantially hermitic seal. Further, aside from the oxygen diffusion path through powdered metal pull post 164, chamber 172 is substantially sealed. As can be appreciated in FIG. 3, embodiments of the present invention can also be practiced by providing a hole, or passageway, extending from an external portion of body portion 154, or pedestal 162 to chamber 172. Moreover, the hole could be filled, or otherwise constructed, with powdered metal therein, or some other suitable material that is substantially impervious to the process liquid, while allowing oxygen therethrough.

Figure 4:
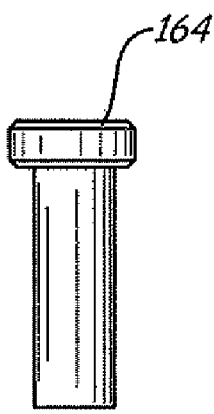
FIG. 4 is an elevation view of a pull post for a piezoelectric-based vortex sensor in accordance with an embodiment of the present invention.

FIG. 4 is a diagrammatic elevation view of pull post 164 in accordance with an embodiment of the present invention. Pull post 164 resembles prior art pull posts, but instead is constructed from a material that allows oxygen therethrough. Preferably, pull post 164 is constructed from powdered metal, such as stainless steel, having a density that is a fraction of that of a solid pull post. More preferably, the density is approximately 90% of that of a solid pull post. However, it is also expressly contemplated that pull post 164 can be constructed as a solid piece, drilled to include a passageway therethrough, and then provided with a liquid barrier, such as powdered metal, or other suitable material, that would inhibit the flow of liquid to a suitably low level while still allowing oxygen to pass therethrough.

Figure 5:
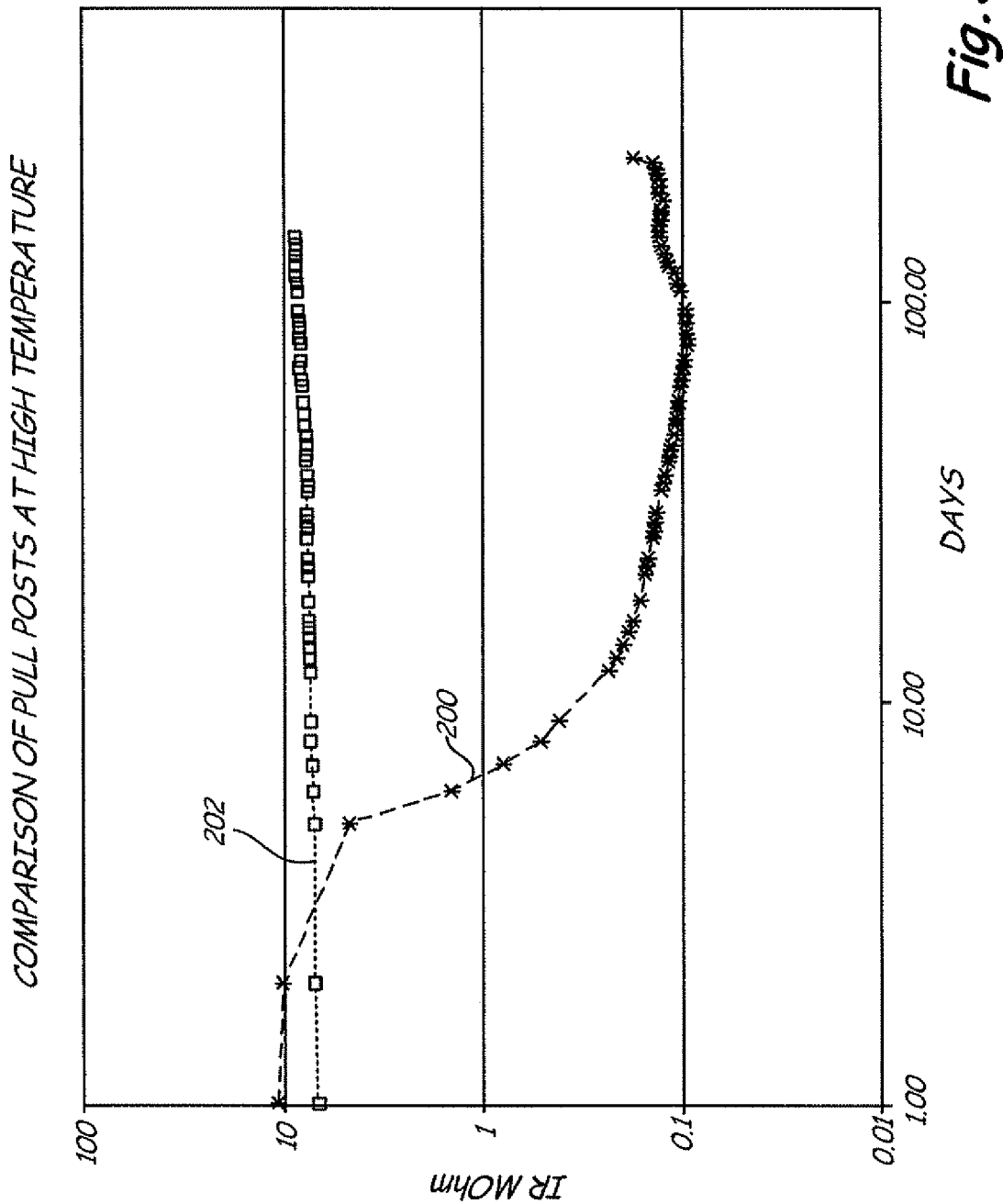
FIG. 5 is a chart illustrating insulation resistance over time comparing prior-art vortex sensor performance to vortex sensor performance for sensors in accordance with embodiments of the present invention.

FIG. 5 is a chart of insulation resistance (IR) which can be used as a proxy for piezo crystal health, comparing prior art vortex sensor performance to vortex sensor performance for sensor in accordance with an embodiment of the present invention. The larger dashed line (200) illustrates that for prior art vortex sensor, insulation resistance shows a marked decline beginning at around eight days. In contrast to prior art vortex sensors, vortex sensors constructed in accordance with embodiments of the present invention perform more reliably. Specifically, the shorter dashed line (illustrated at reference numeral 202) shows that insulation resistance is relatively steady for over 100 days. In fact, the insulation resistance increases slightly. Further still, the insulation resistance is substantially less variable over the duration than that for vortex sensors constructed in accordance with the prior art. Accordingly, it is believed that vortex sensors, and vortex flowmeters, constructed in accordance with embodiments of the present invention will provide more reliable operation in response to high-temperature applications.

Although the present invention has been described with reference to preferred embodiments, workers skilled in the art will recognize that changes may be made in form and detail without departing from the spirit and scope of the invention.

What is claimed is:

1. A process fluid sensor for sensing a characteristic of a process fluid, the sensor comprising:
   a metallic sensor body defining a chamber therein;
   a piezoelectric crystal element disposed proximate the chamber and configured to generate an electrical signal in response to a mechanical input;
   wherein the piezoelectric element is mechanically coupleable to the process fluid, and is sealed within the sensor body; and an oxygen diffusion path configured to convey oxygen to the piezoelectric element.

2. The process fluid sensor of claim 1, wherein the sensor is a vortex sensor.

3. The process fluid sensor of claim 2, wherein the oxygen diffusion path is configured to inhibit liquid flow therethrough.

4. The process fluid sensor of claim 3, wherein the oxygen diffusion path is formed through a porous metallic component.

5. The process fluid sensor of claim 4, wherein the porous metallic component is a pull post of the vortex sensor.

6. The process fluid sensor of claim 4, wherein the porous metallic component has a density that is less than a solid construction of the component.

7. The process fluid sensor of claim 6, wherein the density of the metallic component is about 90% of a solid component.

8. A vortex flowmeter comprising:
an electronics housing containing transmitter electronics;
a vortex sensor coupled to the transmitter electronics, the vortex sensor including:
  a metallic sensor body defining a chamber therein;
  a piezoelectric element disposed proximate the chamber and configured to generate an electrical signal in response to a mechanical input; and
  wherein the piezoelectric element is mechanically coupleable to the process fluid, and is sealed within the sensor body; and
  an oxygen diffusion path configured to convey oxygen to the piezoelectric element.

9. The vortex flowmeter of claim 8, wherein the oxygen diffusion path is configured to inhibit liquid flow therethrough.

10. The vortex flowmeter of claim 9, wherein the oxygen diffusion path is formed through a porous metallic component.

11. The vortex flowmeter of claim 10, wherein the porous metallic component is a pull post of the vortex sensor.

12. The vortex flowmeter of claim 8, wherein the electronics enclosure is mounted proximate the vortex sensor.

13. A pull post of a vortex flowmeter, the pull post being sized to be received by an aperture within a vortex sensor, wherein the pull-post seals a chamber within the vortex sensor except for an oxygen pathway through the pull post.

14. The pull post of claim 13, wherein the pull post is formed of a porous metal.

* * * * *